（12）United States Patent
Difazio et al.

(10) Patent No.: US 11,212,893 B2
(45) Date of Patent: Dec. 28, 2021

(54) LED DRIVER CIRCUIT AND METHOD

(71) Applicant: STMicroelectronics S.r.l., Agrate Brianza (IT)

(72) Inventors: Salvatore Difazio, Catania (IT); Stefano Corradi, Syracuse (IT); Giuseppe Calcagno, Messina (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 16/885,507

(22) Filed: May 28, 2020

(65) Prior Publication Data

US 2021/0378066 A1    Dec. 2, 2021

(51) Int. Cl.
 *H05B 45/34*    (2020.01)
 *H03M 1/78*    (2006.01)
 *H05B 45/345*    (2020.01)

(52) U.S. Cl.
 CPC .......... *H05B 45/345* (2020.01); *H03M 1/785* (2013.01)

(58) Field of Classification Search
 CPC ........ H05B 45/00; H05B 45/30; H05B 45/34; H05B 45/345; H05B 45/37; H03M 1/78; H03M 1/785
 See application file for complete search history.

(56) References Cited

U.S. PATENT DOCUMENTS

| | | | |
|---|---|---|---|
| 6,002,354 A * | 12/1999 | Itoh | H03M 1/68 341/144 |
| 6,693,394 B1 | 2/2004 | Guo et al. | |
| 7,605,735 B2 * | 10/2009 | Chen | H03M 1/687 341/144 |
| 8,283,876 B2 | 10/2012 | Ji | |
| 8,362,706 B1 | 1/2013 | Godbole | |
| 8,786,213 B2 | 7/2014 | Yang et al. | |
| 10,951,227 B1 * | 3/2021 | Thinakaran | H03M 1/68 |

* cited by examiner

*Primary Examiner* — Jimmy T Vu
(74) *Attorney, Agent, or Firm* — Slater Matsil, LLP

(57) ABSTRACT

An apparatus includes a digital-to-analog converter coupled in series with a source follower, wherein the digital-to-analog converter is configured to control a current flowing through the source follower, and an amplifier having a first input coupled to a reference generator, a second input coupled to a common node of the source follower and the digital-to-analog converter, and an output coupled to a gate of the source follower.

20 Claims, 8 Drawing Sheets

LED DRIVER CIRCUIT AND METHOD

TECHNICAL FIELD

The description relates generally to driver circuits, and in particular embodiments to a light-emitting diode (LED) current adjustment apparatus in a driver circuit and a corresponding control method.

BACKGROUND

A light-emitting diode (LED) is an electronic device that emits light when an electric current flows through it. In order to properly drive the LED so as to provide more efficient and reliable LED lighting, a driver circuit is employed to produce the current and voltage necessary to turn on the LED. For example, the driver circuit is configured to covert a dc voltage such as 12 V from a battery pack to a regulated current for driving the LED.

The most common LED driver is a voltage controlled current source. The voltage controlled current source is coupled in series with an LED or a plurality of LEDs. The voltage controlled current source comprises a first current adjustment portion and a second current adjustment portion used alternatively.

The first current adjustment portion is configured to provide a coarse adjustment of the current flowing through the LED. The second current adjustment portion is configured to provide a fine adjustment of the current flowing through the LED.

The first current adjustment portion of the LED driver comprises a first digital-to-analog converter, a first amplifier, a first source follower and a first resistor. The first source follower and the first resistor are coupled in series. The first digital-to-analog converter is configured to receive a first digital reference signal, and convert this signal into a first analog reference signal fed into a non-inverting input of the first amplifier. An inverting input of the first amplifier is coupled to a common node of the first source follower and the first resistor. An output of the first amplifier is coupled to a gate of the first source follower. The first analog reference signal is applied to the first resistor. The current flowing through the first resistor can be adjusted in a coarse manner through adjusting the first analog reference signal.

The second current adjustment portion of the LED driver comprises a second digital-to-analog converter, a second amplifier, a second source follower and a second resistor. The second source follower and the second resistor are coupled in series. The second digital-to-analog converter is configured to receive a second digital reference signal, and convert this signal into a second analog reference signal fed into a non-inverting input of the second amplifier. An inverting input of the second amplifier is coupled to a common node of the second source follower and the second resistor. An output of the second amplifier is coupled to a gate of the second source follower. The second analog reference signal is applied to the second resistor. The current flowing through the second resistor can be adjusted in a fine manner through adjusting the second analog reference signal.

The LED driver described above requires two digital-to-analog converters for programming the LED current. Furthermore, the LED driver requires two amplifiers and two resistors for the fine current adjustment and the coarse current adjustment, respectively. The resistance values of the first resistor and the second resistor may vary when the temperature changes. The temperature-dependent characteristics of these two resistors may result in deteriorating accuracy during the LED current adjustment processes. It is desirable to have a simple and reliable LED driver to regulate and adjust the current flowing through the LED accurately.

SUMMARY

In accordance with an embodiment, an apparatus comprises a digital-to-analog converter coupled in series with a source follower, wherein the digital-to-analog converter is configured to control a current flowing through the source follower, and an amplifier having a first input coupled to a reference generator, a second input coupled to a common node of the source follower and the digital-to-analog converter, and an output coupled to a gate of the source follower.

In accordance with another embodiment, a method comprises configuring an digital-to-analog converter to operate in a fine current adjustment mode to control a current flowing through a source follower coupled in series with the digital-to-analog converter, and configuring the digital-to-analog converter to operate in a coarse current adjustment mode to control the current flowing through the source follower coupled in series with the digital-to-analog converter, wherein the digital-to-analog converter comprises a first digital-to-analog conversion device controlled by lower bits of a digital signal, and a second digital-to-analog conversion device controlled by upper bits of the digital signal.

In accordance with yet another embodiment, an apparatus comprises a first digital-to-analog converter configured to receive lower bits of a digital signal and convert the lower bits into a first analog current, a second digital-to-analog converter configured to receive upper bits of the digital signal and convert the upper bits into a second analog current, a source follower having a first drain/source terminal coupled to an electronic device, and a second drain/source terminal coupled to the first digital-to-analog converter and the second digital-to-analog converter, wherein a current flowing through the source follower is equal to a sum of the first analog current and the second analog current, and an amplifier having a first input coupled to a reference generator, a second input coupled to the second drain/source terminal of the source follower, and an output coupled to a gate of the source follower.

The foregoing has outlined rather broadly the features and technical advantages of the present disclosure in order that the detailed description of the disclosure that follows may be better understood. Additional features and advantages of the disclosure will be described hereinafter which form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

For a more complete understanding of the present disclosure, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the various embodiments and are not necessarily drawn to scale.

DETAILED DESCRIPTION OF ILLUSTRATIVE EMBODIMENTS

The making and using of embodiments of this disclosure are discussed in detail below. It should be appreciated, however, that the concepts disclosed herein can be embodied in a wide variety of specific contexts, and that the specific embodiments discussed herein are merely illustrative and do not serve to limit the scope of the claims. Further, it should be understood that various changes, substitutions and alterations can be made herein without departing from the spirit and scope of this disclosure as defined by the appended claims.

The present disclosure will be described with respect to preferred embodiments in a specific context, namely an LED current adjustment apparatus. The present disclosure may also be applied, however, to a variety of systems and applications that adjust a current flowing through an electronic device. For example, the present disclosure may be applied to applications where either a sink current (e.g., common cathode LED panels) or a source current (e.g., common anode LED panels) is required. Hereinafter, various embodiments will be explained in detail with reference to the accompanying drawings.

Figure 1:
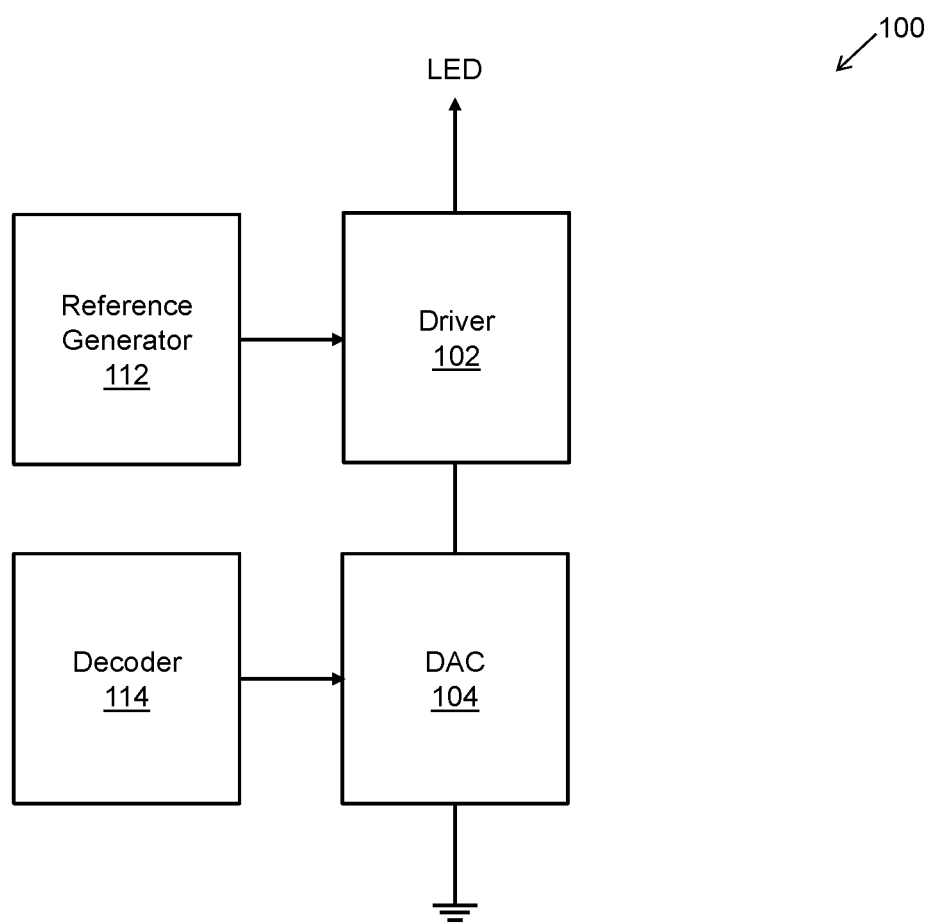
FIG. 1 illustrates a block diagram of an LED current adjustment apparatus in accordance with various embodiments of the present disclosure.

FIG. 1 illustrates a block diagram of an LED current adjustment apparatus in accordance with various embodiments of the present disclosure. The LED current adjustment apparatus wo comprises a driver 102, a digital-to-analog converter 104, a reference generator 112 and a decoder 114. As shown in FIG. 1, the driver 102 and the digital-to-analog converter 104 are coupled in series between an LED (a light emitting diode or a plurality of light emitting diodes) and ground. The reference generator 112 is configured to provide a reference signal fed into the driver 102. In some embodiments, the reference signal is a voltage reference signal applied to the digital-to-analog converter 104 through the driver 102. The decoder 114 is configured to receive a system LED current adjustment command, and convert this system LED current adjustment command into a digital signal, which is applied to the digital-to-analog converter 104. In response to this digital signal, the digital-to-analog converter 104 is capable of adjusting the current flowing through the LED.

In some embodiments, the digital-to-analog converter 104 is implemented as a segmented digital-to-analog converter. The segmented digital-to-analog converter may be configured as a coarse and/or fine digital-to-analog converter. Such a configuration can be used to replace two digital-to-analog converters (two DACs for coarse and fine current adjustment respectively) commonly used in a conventional LED current adjustment apparatus. Throughout the description, the digital-to-analog converter 104 may be alternatively referred to as a segmented digital-to-analog converter.

The segmented digital-to-analog converter 104 comprises a first digital-to-analog conversion device and a second digital-to-analog conversion device. In some embodiments, the first digital-to-analog conversion device is controlled by lower bits of the digital signal. More particularly, the first digital-to-analog conversion device converts the lower bits of the digital signal into a first analog current. The second digital-to-analog conversion device is controlled by upper bits of the digital signal. More particularly, the second digital-to-analog conversion device converts the upper bits of the digital signal into a second analog current. The current flowing through the driver 102 is the sum of the first analog current and the second analog current.

In some embodiments, the first digital-to-analog conversion device is a R2R digital-to-analog converter. The R2R digital-to-analog converter is also known as an R-2R resistor ladder network. The second digital-to-analog conversion device is a thermometric digital-to-analog converter. In some embodiments, the R2R digital-to-analog converter is controlled by L bits of the digital signal. L is an integer equal or greater than one. The L bits are the lower bits of the digital signal. The thermometric digital-to-analog converter is controlled by M bits of the digital signal. M is an integer equal or greater than one. The M bits are the upper bits of the digital signal.

In operation, the LED current adjustment apparatus wo may be configured to operate in different current adjustment modes. In some embodiments, the LED current adjustment apparatus wo is configured to operate in a fine current adjustment mode. In the fine current adjustment mode, the digital signal has 15 bits. L is equal to 6, and M is equal to 9. In some embodiments, the LED current adjustment apparatus wo is configured to operate in a coarse current adjustment mode. In the coarse current adjustment mode, the digital signal has 10 bits. The four most significant bits of this digital signal are tied to zero. The least significant bits are shifted to the left by one bit. L is equal to 5, and M is equal to 9 (four of the most significant bits are tied to zero). The detailed structures and operating principles of the R2R digital-to-analog converter and the thermometric digital-to-analog converter will be described below with respect to FIGS. 4-7.

In operation, the R2R digital-to-analog converter and the thermometric digital-to-analog converter are configured to leave the fine current adjustment mode and enter into the coarse current adjustment mode. During a transition from the fine current adjustment mode to the coarse current adjustment mode, control bits for controlling the R2R digital-to-analog converter are shifted to the left by one bit.

In operation, the R2R digital-to-analog converter and the thermometric digital-to-analog converter are configured to operate in the fine current adjustment mode. In the fine current adjustment mode, the R2R digital-to-analog converter and is configured as a 6-bit R2R digital-to-analog converter. The thermometric digital-to-analog converter is configured as a 9-bit thermometric digital-to-analog converter.

In operation, the R2R digital-to-analog converter and the thermometric digital-to-analog converter are configured to operate in the coarse current adjustment mode. In the coarse current adjustment mode, the R2R digital-to-analog converter is configured as a 6-bit R2R digital-to-analog converter. The least significant bit of the 6-bit R2R digital-to-analog converter is tied to a logic high state. The thermometric digital-to-analog converter is configured as a 9-bit thermometric digital-to-analog converter. The four most significant bits of the 9-bit thermometric digital-to-analog converter are tied to a logic low state.

Figure 2:
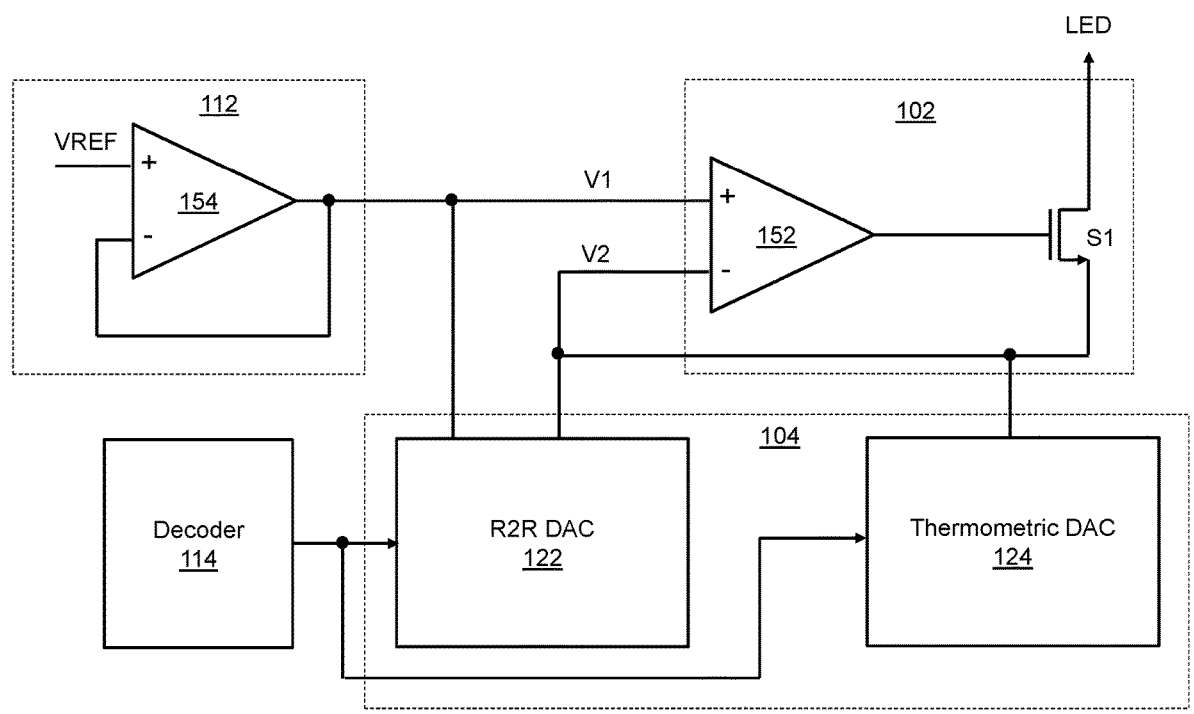
FIG. 2 illustrates a schematic diagram of the LED current adjustment apparatus shown in FIG. 1 in accordance with various embodiments of the present disclosure.

FIG. 2 illustrates a schematic diagram of the LED current adjustment apparatus shown in FIG. 1 in accordance with various embodiments of the present disclosure. The driver 102 comprises a first amplifier 152 and a source follower S1. As shown in FIG. 2, the source follower S1 is implemented as an n-type transistor. A first drain/source terminal of the source follower S1 is a drain of the source follower. The drain of the source follower S1 is coupled to the LED. In other words, the current flowing through the source follower S1 is substantially equal to the current flowing through the LED. A second drain/source terminal of the source follower S1 is a source of the source follower. The source of the source follower S1 is coupled to the segmented digital-to-analog converter 104. The gate of the source follower S1 is coupled to the output of the first amplifier 152. The non-inverting input of the first amplifier 152 is coupled to a first voltage bus V1. The inverting input of the first amplifier 152 is coupled to a second voltage bus V2. The second voltage bus V2 is also coupled to the source of the source follower S1.

The reference generator 112 comprises a second amplifier 154. The non-inverting input of the second amplifier 154 is configured to receive a reference signal VREF. The reference signal VREF is generated by a current source and a resistor, which will be described in detail below with respect to FIG. 3. The inverting input of the second amplifier 154 is coupled to the output of the second amplifier 154. The output of the second amplifier 154 is coupled to the non-inverting input of the first amplifier 152. As shown in FIG. 2, the second amplifier 154 is configured as a buffer. The output voltage of the second amplifier 154 is substantially equal to the voltage of the reference signal VREF.

It should be noted that both the first amplifier 152 and the second amplifier 154 may have an offset. In some embodiments, this offset is about +/−10 millivolts at a five-sigma level. Furthermore, the resistor may have a mismatch (<0.5%). Both the mismatch of the resistor and the offset of the amplifiers can be compensated by a suitable current trimming circuit.

The segmented digital-to-analog converter 104 is formed by two digital-to-analog converters, namely a R2R digital-to-analog converter 122 and a thermometric digital-to-analog converter 124. The detailed schematic diagrams of these two digital-to-analog converters will be described below with respect to FIGS. 6 and 7, respectively.

As shown in FIG. 2, the R2R digital-to-analog converter 122 is configured to receive a digital signal generated by the decoder 114. More particularly, lower bits of the digital signal are fed into the R2R digital-to-analog converter 122. The R2R digital-to-analog converter 122 is also coupled to the voltage buses V1 and V2 as shown in FIG. 2. In response to the received digital signal (lower bits of the digital signal), the R2R digital-to-analog converter 122 converts the lower bits of the digital signal into an analog current flowing through the R2R digital-to-analog converter 122. Since the inputs of the first amplifier 152 are high-impedance inputs, the current flowing through the R2R digital-to-analog converter 122 comes from the current flowing through the source follower S1. The detailed operating principle of the R2R digital-to-analog converter 122 will be described below with respect to FIG. 6.

As shown in FIG. 2, the thermometric digital-to-analog converter 124 is configured to receive the digital signal generated by the decoder 114. More particularly, upper bits of the digital signal are fed into the thermometric digital-to-analog converter 124. The thermometric digital-to-analog converter 124 is also coupled to the voltage bus V2 as shown in FIG. 2. In response to the received digital signal (upper bits of the digital signal), the thermometric digital-to-analog converter 124 converts the upper bits of the digital signal into an analog current flowing through the thermometric digital-to-analog converter 124. Since the inverting input of the first amplifier 152 is a high-impedance input, the current flowing through the thermometric digital-to-analog converter 124 comes from the current flowing through the source follower S1. The detailed operating principle of the thermometric digital-to-analog converter 124 will be described below with respect to FIG. 7.

It should be noted the current flowing through the source follower S1 is the sum of the current flowing through the R2R digital-to-analog converter 122 and the current flowing through the thermometric digital-to-analog converter 124. By generating different digital signals, the currents flowing through the R2R digital-to-analog converter 122 and the thermometric digital-to-analog converter 124 may vary accordingly. As a result, the current flowing through the source follower S1 may change in response to the variation of the digital signal. As described above, the current flowing through the source follower S1 is substantially equal to the current flowing through the LED. As such, the current of the LED can be controlled through adjusting the output of the decoder 114.

In operation, the first amplifier 152 having an output coupled to the gate of the source follower S1 forces the voltage of the source of the source follower S1 to be at about V1 (VREF) by forcing the difference between the inverting and non-inverting terminals of the first amplifier 152 to be about zero volts. As such, the voltage applied to the R2R digital-to-analog converter 122 and the thermometric digital-to-analog converter 124 is substantially equal to VREF.

One advantageous feature of the LED current adjustment apparatus shown in FIG. 2 is that a single digital-to-analog converter (e.g., segmented digital-to-analog converter 104) is employed to achieve two different current adjustments. This simple solution helps to reduce temperature and process related variations. Furthermore, this solution helps to reduce the silicon area consumption, thereby reducing the cost of the LED current adjustment apparatus.

Figure 3:
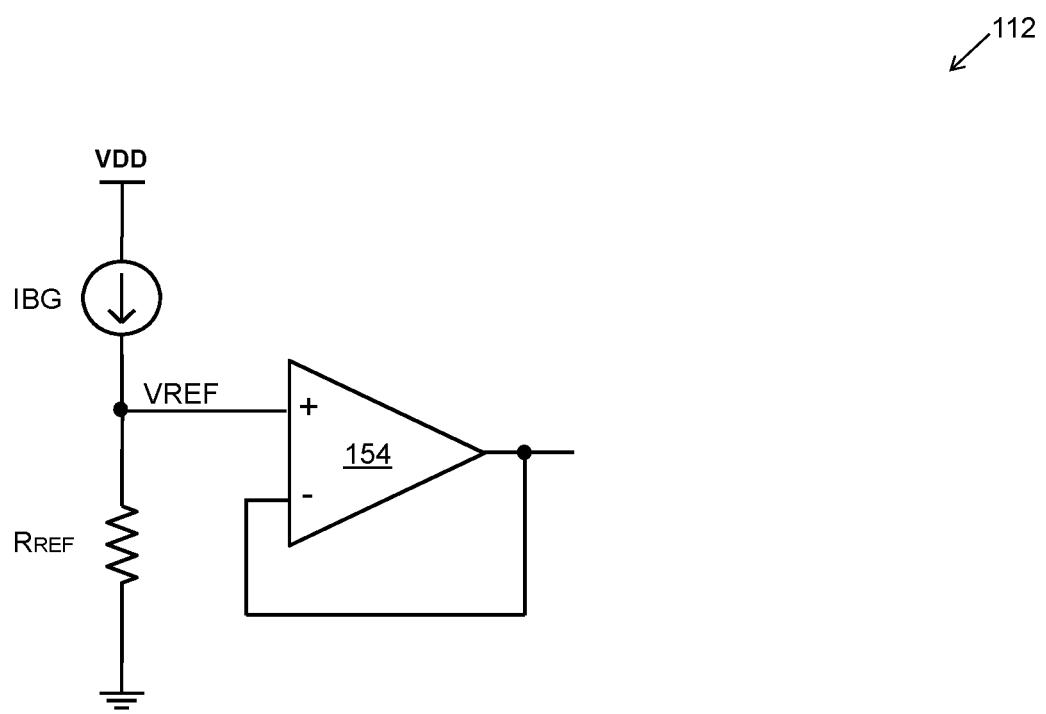
FIG. 3 illustrates a schematic diagram of the reference generator shown in FIG. 1 in accordance with various embodiments of the present disclosure.

FIG. 3 illustrates a schematic diagram of the reference generator shown in FIG. 1 in accordance with various embodiments of the present disclosure. The reference generator 112 comprises a current source IBG, a resistor $R_{REF}$ and the second amplifier 154. As shown in FIG. 3, the current source IBG and the resistor $R_{REF}$ are coupled in series between a bias power supply VDD and ground. The common node of the current source IBG and the resistor $R_{REF}$ is coupled to the non-inverting input of the second amplifier 154. The inverting input of the second amplifier 154 is coupled to the output of the second amplifier 154.

In operation, the current of the current source IBG flows through the resistor $R_{REF}$ to generate a digital-to-analog conversion voltage reference VREF. The current of the current source IBG is a temperature compensated current. In some embodiments, the temperature compensated current of the current source IBG may be achieved through suitable temperature compensation techniques such as the temperature compensation technique used in the bandgap voltage reference.

The temperature compensated current of the current source IBG has the smallest temperature coefficient (TC). For example, the TC of the current of the current source IBG is less than 30 ppm/degree. In some embodiments, the TC of the current of the current source IBG is about zero.

The resistor $R_{REF}$ and the resistors in the segmented digital-to-analog converter 104 (shown in FIGS. 6 and 7) are the same kind of resistors. In some embodiments, the temperature and/or process drifts of the resistor $R_{REF}$ and the resistors in the segmented digital-to-analog converter 104 are equal and opposite. As a result, the impacts from the resistor $R_{REF}$ and the resistors in the segmented digital-to-analog converter 104 may cancel each other out.

One advantageous feature of having a temperature compensated reference generator is by temperature compensating the reference generator, an accurate voltage reference can be ensured over a wide range of temperatures. Accordingly, the current flowing through the LED can be ensured to be sufficiently accurate over various operating conditions.

Figure 4:
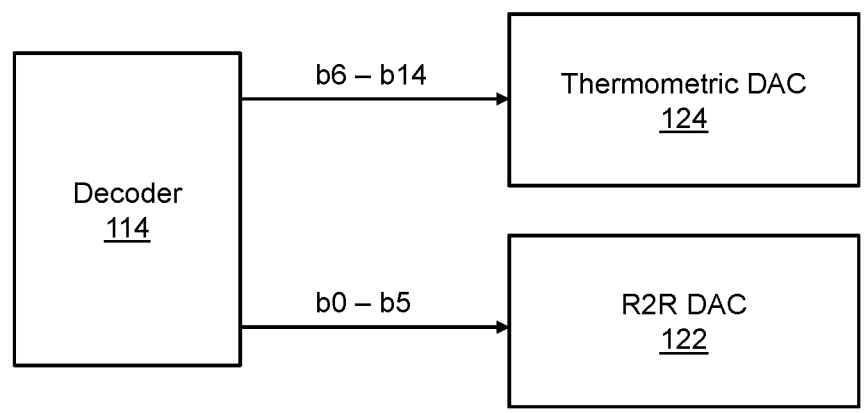
FIG. 4 illustrates a block diagram of the decoder operating in a fine current adjustment mode in accordance with various embodiments of the present disclosure.

FIG. 4 illustrates a block diagram of the decoder operating in a fine current adjustment mode in accordance with various embodiments of the present disclosure. In some embodiments, the LED current adjustment apparatus 100 is configured to operate two different operating modes, namely a fine current adjustment mode and a coarse current adjustment mode. In response to the fine current adjustment mode, the decoder 114 is configured to generate a digital signal having 15 bits. The lower six bits (b0-b5) are fed into the R2R digital-to-analog converter 122. In the R2R digital-to-analog converter 122, the lower five bits are converted into a corresponding analog current. The upper nine bits (b6-b14) are fed into the thermometric digital-to-analog converter 124. In the thermometric digital-to-analog converter 124, the upper nine bits are converted into a corresponding analog current. The sum of the currents flowing through the R2R digital-to-analog converter 122 and the thermometric digital-to-analog converter 124 is the current flowing through the LED in the fine current adjustment mode.

Figure 5:
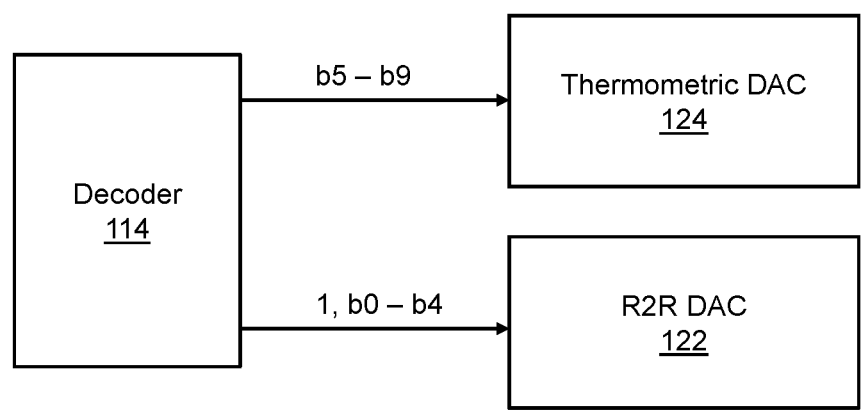
FIG. 5 illustrates a block diagram of the decoder operating in a coarse current adjustment mode in accordance with various embodiments of the present disclosure.

FIG. 5 illustrates a block diagram of the decoder operating in a coarse current adjustment mode in accordance with various embodiments of the present disclosure. In response to the coarse current adjustment mode, the decoder 114 is configured to generate a digital signal having 15 bits. During the transition from the fine current adjustment mode to the coarse current adjustment mode, the lower bits of the digital signal are shifted to the left by one bit, and four most significant bits of the digital signal are tied to a logic high state. As such, the lower five bits (1, b0-b4) are fed into the R2R digital-to-analog converter 122. In the R2R digital-to-analog converter 122, the lower five bits are converted into a corresponding analog current. The upper five bits (b5-b9) are fed into the thermometric digital-to-analog converter 124. In the thermometric digital-to-analog converter 124, the upper five bits are converted into a corresponding analog current. The sum of the currents flowing through the R2R digital-to-analog converter 122 and the thermometric digital-to-analog converter 124 is the current flowing through the LED in the coarse current adjustment mode.

Figure 6:
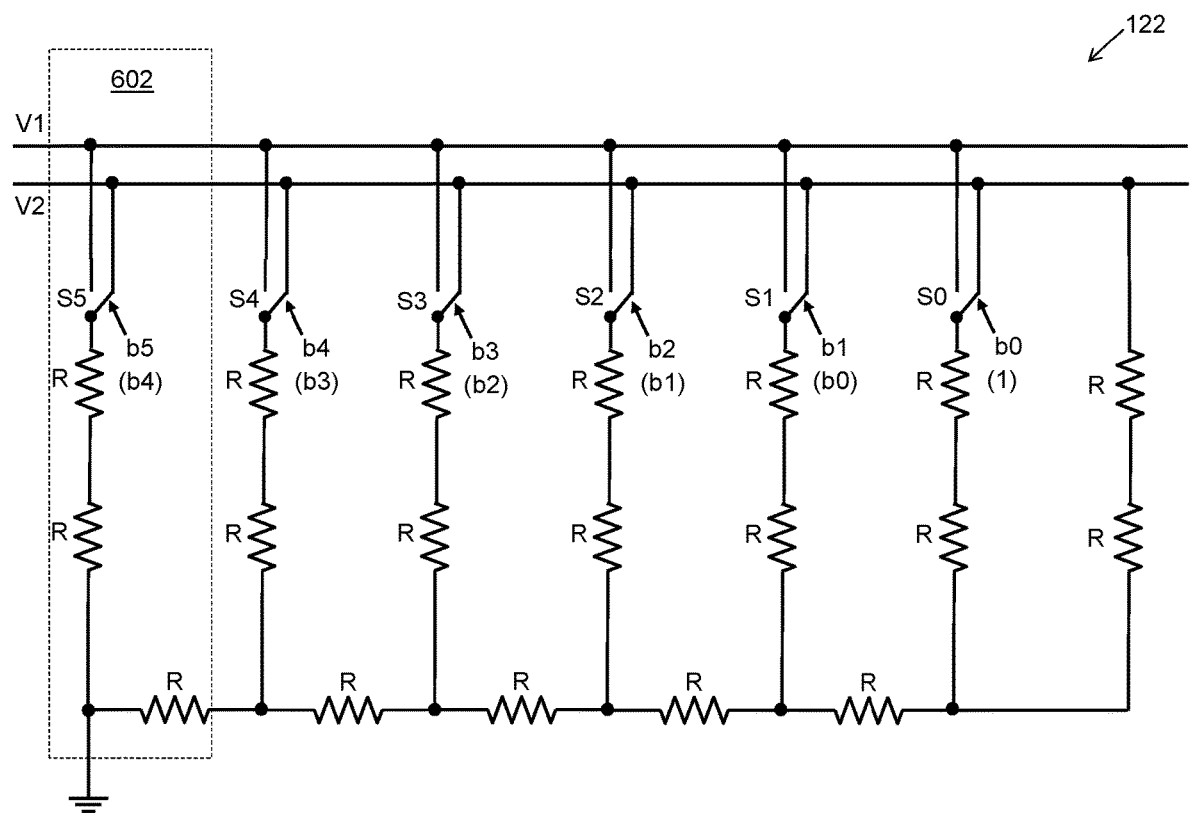
FIG. 6 illustrates a schematic diagram of the R2R digital-to-analog converter shown in FIG. 2 in accordance with various embodiments of the present disclosure.

FIG. 6 illustrates a schematic diagram of the R2R digital-to-analog converter shown in FIG. 2 in accordance with various embodiments of the present disclosure. In some embodiments, the R2R digital-to-analog converter may have n number of branches. In some embodiments, n is an integer equal or greater than one. In some embodiments, the R2R digital-to-analog converter 122 is implemented as a R2R digital-to-analog converter having six branches as shown in FIG. 6.

As shown in FIG. 6, each branch 602 includes a horizontal resistor R having a resistor value "R" and a vertical resistor (two resistors coupled in series) having a resistor value "2R" as shown in FIG. 6. The vertical resistor of each branch is coupled to the voltage buses V1 and V2 through a control switch (e.g., control switch S0-S5). One bit of the digital signal is used to control a corresponding control switch. Depending on the logic state of the bit of the digital signal, the vertical resistor may be coupled to either the first voltage bus V1 or the second voltage bus V2. The R2R digital-to-analog converter further comprises a dummy branch (two rightmost resistors). As shown in FIG. 6, the dummy branch is coupled to the second voltage bus V2.

In operation, the R2R digital-to-analog converter 122 may be used in converting a digital signal into a corresponding analog signal. For example, the R2R digital-to-analog converter 122 may generate a current corresponding to the digital signal. The operating principle of the R2R digital-to-analog converter is well known in the art, and hence is not discussed in further detail to avoid repetition.

It should be noted that the diagram shown in FIG. 6 is merely an example, which should not unduly limit the scope of the claims. One of ordinary skill in the art would recognize many variations, alternatives, and modifications. For example, one skilled in the art would recognize that the R2R digital-to-analog converter shown in FIG. 6 is simply one manner of generating the LED current and that other and alternate embodiment digital-to-analog converters could be employed (such as employing a binary weighted converter) for generating the LED current. The final choice is dictated by the resolution and precision required in the application.

Referring back to FIG. 1, the LED current adjustment apparatus wo may be configured to operate in the fine current adjustment mode. In the fine current adjustment mode, the current flowing through the R2R digital-to-analog converter can be expressed by the following equation:

$$I_{R2R\_fine} = IBG \times \frac{R_{REF}}{R} \times \left( \frac{b5}{2^1} + \frac{b4}{2^2} + \frac{b3}{2^3} + \frac{b2}{2^4} + \frac{b1}{2^5} + \frac{b0}{2^6} \right) \quad (1)$$

Alternatively, the LED current adjustment apparatus wo may be configured to operate in the coarse current adjustment mode. In the coarse current adjustment mode, the current flowing through the R2R digital-to-analog converter can be expressed by the following equation:

$$I_{R2R\_coarse} = IBG \times \frac{R_{REF}}{R} \times \left( \frac{b4}{2^1} + \frac{b3}{2^2} + \frac{b2}{2^3} + \frac{b1}{2^4} + \frac{b0}{2^5} + \frac{1}{2^6} \right) \quad (2)$$

Figure 7:
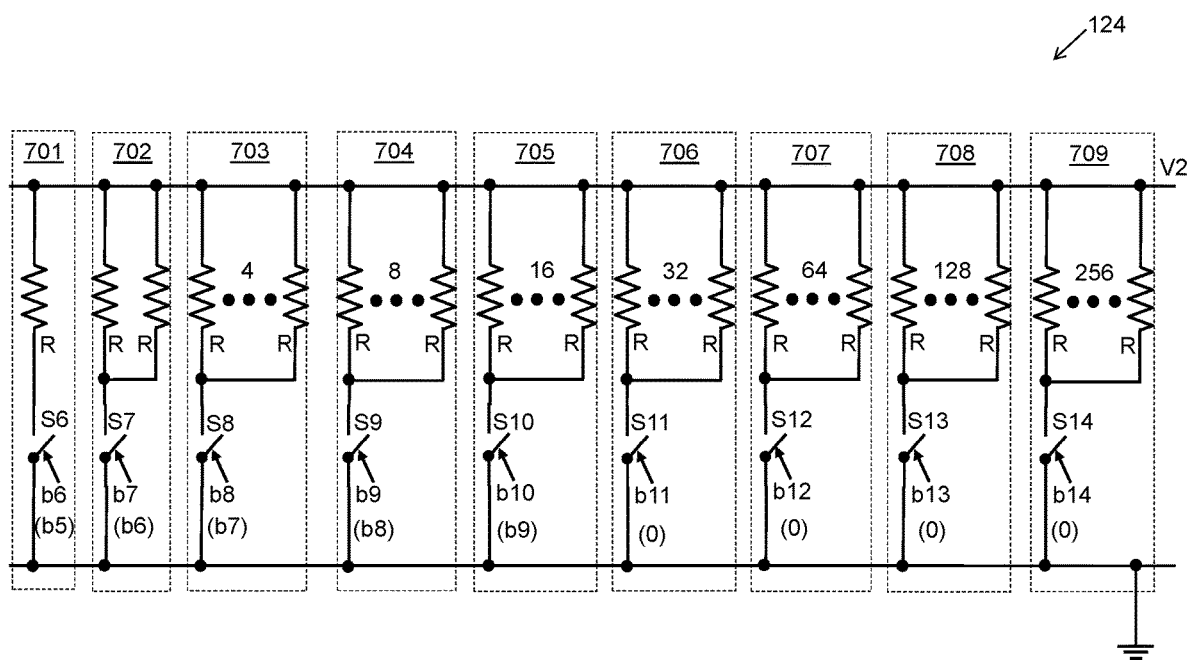
FIG. 7 illustrates a schematic diagram of a binary weighted digital-to-analog converter shown in FIG. 2 in accordance with various embodiments of the present disclosure.

FIG. 7 illustrates a schematic diagram of a binary weighted digital-to-analog converter shown in FIG. 2 in accordance with various embodiments of the present disclosure. In some embodiments, the thermometric digital-to-analog converter may have n number of branches. In some embodiments, n is an integer equal or greater than one. In some embodiments, the thermometric digital-to-analog converter 124 is implemented as a binary weighted digital-to-analog converter having nine branches 701-709 as shown in FIG. 7.

As shown in FIG. 7, each branch is a binary weighted current source. In the first branch 701, the current of this branch is equal to V2 divided by R. In the second branch 702, two resistors are connected in parallel. The equivalent resistance is one half of that of the first branch 701. As such, the current of the second branch is 702 is twice as much as that of the first branch 701. In the third branch 703, four resistors are connected in parallel. The current of the third branch is 703 is twice as much as that of the second branch 702. In sum, for two adjacent branches (e.g., branches 707 and 708), the current of the right branch (e.g., branch 708) is twice as much as that of the left branch (e.g., branch 707).

In operation, the thermometric digital-to-analog converter 124 may be used in converting a digital signal into a corresponding analog signal. For example, the thermometric digital-to-analog converter 124 may generate a current corresponding to the digital signal. The operating principle of the thermometric digital-to-analog converter is well known in the art, and hence is not discussed in further detail to avoid repetition.

It should be noted that the diagram shown in FIG. 7 is merely an example, which should not unduly limit the scope of the claims. One of ordinary skill in the art would recognize many variations, alternatives, and modifications. For example, one skilled in the art would recognize that the thermometric digital-to-analog converter shown in FIG. 7 is simply one manner of generating the LED current and that other and alternate embodiment digital-to-analog converters could be employed for this function. The final choice is dictated by the resolution and precision required in the application.

Referring back to FIG. 1, the LED current adjustment apparatus wo may be configured to operate in the fine current adjustment mode. In the fine current adjustment mode, the current flowing through the thermometric digital-to-analog converter 124 can be expressed by the following equation:

$$I_{TM\_fine} = \qquad (3)$$
$$IBG \times \frac{R_{REF}}{R} \times (b14 \cdot 2^8 + b13 \cdot 2^7 + b12 \cdot 2^6 + b11 \cdot 2^5 + b10 \cdot 2^4 +$$
$$b9 \cdot 2^3 + b8 \cdot 2^2 + b7 \cdot 2^1 + b6 \cdot 2^0)$$

Alternatively, the LED current adjustment apparatus wo may be configured to operate in the coarse current adjustment mode. In the coarse current adjustment mode, the current flowing through the thermometric digital-to-analog converter 124 can be expressed by the following equation:

$$I_{R2R\_coarse} = IBG \times \frac{R_{REF}}{R} \times (0 \cdot 2^8 + 0 \cdot 2^7 + 0 \cdot 2^6 + \qquad (4)$$
$$0 \cdot 2^5 + b9 \cdot 2^4 + b8 \cdot 2^3 + b7 \cdot 2^2 + b6 \cdot 2^1 + b5 \cdot 2^0)$$

Referring back to FIG. 2, the current flowing through the LED is the sum of the current flowing through the thermometric digital-to-analog converter 124 and the current flowing through R2R digital-to-analog converter 122. The current flowing through the LED can be expressed by the following equation:

$$I_{LED} = IBG \times \frac{R_{REF}}{R} \times \left( \sum_{m=0}^{M-1} b_{m+L} \cdot 2^m + \sum_{n=0}^{L-1} \frac{bn}{2^{L-n}} + \frac{1}{2^L} \right) \qquad (5)$$

In Equation (5), in some embodiments, M is equal to 9, and L is equal to 6. The last element ($\frac{1}{2^L}$) is an offset. This offset is employed to set the full scale value at $2^{L+M} \times IBG \times R_{REF}/R$.

Figure 8:
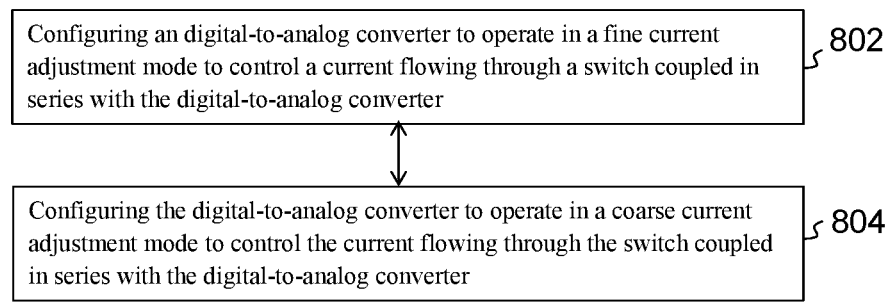
FIG. 8 illustrates a flow chart of a method for controlling the LED current adjustment apparatus shown in FIG. 1 in accordance with various embodiments of the present disclosure.

FIG. 8 illustrates a flow chart of a method for controlling the LED current adjustment apparatus shown in FIG. 1 in accordance with various embodiments of the present disclosure. This flowchart shown in FIG. 8 is merely an example, which should not unduly limit the scope of the claims. One of ordinary skill in the art would recognize many variations, alternatives, and modifications. For example, various steps illustrated in FIG. 8 may be added, removed, replaced, rearranged and repeated.

An LED current adjustment apparatus comprises a digital-to-analog converter. The digital-to-analog converter is formed by a first digital-to-analog converter and a second digital-to-analog converter. The first digital-to-analog converter is configured to receive lower bits of a digital signal, and convert the lower bits into a first analog current. The second digital-to-analog converter is configured to receive upper bits of the digital signal, and convert the upper bits into a second analog current. The first digital-to-analog converter is a R2R digital-to-analog converter. The second digital-to-analog converter is a thermometric digital-to-analog converter.

The LED current adjustment apparatus further comprises a source follower and an amplifier. The source follower has a first drain/source terminal coupled to an electronic device (e.g., an LED), and a second drain/source terminal coupled to the digital-to-analog converter. A current flowing through the source follower is equal to a sum of the first analog current and the second analog current. The amplifier has a first input coupled to a reference generator, a second input coupled to the second drain/source terminal of the source follower, and an output coupled to a gate of the source follower.

The LED current adjustment apparatus may be configured to operate in different current adjustment modes, namely a fine current adjustment mode and a coarse current adjustment mode.

At step 802, the digital-to-analog converter is configured to operate in the fine current adjustment mode to control the current flowing through the source follower coupled in series with the digital-to-analog converter. In the fine current adjustment mode, the first digital-to-analog conversion device is configured as a 6-bit R2R digital-to-analog converter, and the second digital-to-analog conversion device is configured as a 9-bit thermometric digital-to-analog converter.

At step 804, the digital-to-analog converter is configured to operate in the coarse current adjustment mode to control the current flowing through the source follower coupled in series with the digital-to-analog converter. In the coarse current adjustment mode, the first digital-to-analog conversion device is configured as a 6-bit R2R digital-to-analog converter having the least significant bit tied to a logic high state. The second digital-to-analog conversion device is configured as a 9-bit thermometric digital-to-analog converter having four most significant bits tied to a logic low state.

It should be noted that the flow chart shown in FIG. 8 is merely an example, which should not unduly limit the scope of the claims. One of ordinary skill in the art would recognize many variations, alternatives, and modifications. For example, depending on different applications and design needs, the coarse current adjustment mode may be executed prior to the fine current adjustment mode.

Although embodiments of the present disclosure and its advantages have been described in detail, it should be understood that various changes, substitutions and alterations can be made herein without departing from the spirit and scope of the disclosure as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. An apparatus comprising:
a digital-to-analog converter coupled in series with a source follower, wherein the digital-to-analog converter is a segmented digital-to-analog converter, and the digital-to-analog converter is configured to control a current flowing through the source follower; and
an amplifier having a first input coupled to a reference generator, a second input coupled to a common node of the source follower and the digital-to-analog converter, and an output coupled to a gate of the source follower.

2. The apparatus of claim 1, wherein the digital-to-analog converter comprises:
a first digital-to-analog conversion device controlled by lower bits of a digital signal; and
a second digital-to-analog conversion device controlled by upper bits of the digital signal.

3. The apparatus of claim 2, further comprising:
the first digital-to-analog conversion device is a R2R digital-to-analog converter; and
the second digital-to-analog conversion device is a thermometric digital-to-analog converter.

4. The apparatus of claim 3, wherein:
the R2R digital-to-analog converter and the thermometric digital-to-analog converter are configured to operate in a fine current adjustment mode, and wherein under the fine current adjustment mode, the first digital-to-analog conversion device is configured as a 6-bit R2R digital-to-analog converter, and the second digital-to-analog conversion device is configured as a 9-bit thermometric digital-to-analog converter.

5. The apparatus of claim 3, wherein:
the R2R digital-to-analog converter and the thermometric digital-to-analog converter are configured to operate in a coarse current adjustment mode, and wherein under the coarse current adjustment mode, the first digital-to-analog conversion device is configured as a 6-bit R2R digital-to-analog converter having a least significant bit tied to a logic high state, and the second digital-to-analog conversion device is configured as a 9-bit thermometric digital-to-analog converter having four most significant bits tied to a logic low state.

6. The apparatus of claim 3, wherein:
the R2R digital-to-analog converter and the thermometric digital-to-analog converter are configured to leave a fine current adjustment mode and enter into a coarse current adjustment mode, and wherein during a transition from the fine current adjustment mode to the coarse current adjustment mode, control bits for controlling the R2R digital-to-analog converter are shifted to the left by one bit.

7. The apparatus of claim 1, wherein:
the reference generator comprises a current source and a reference resistor and a reference amplifier, wherein:
the current source and the reference resistor are coupled in series;
a first input of the reference amplifier is coupled to a common node of the current source and the reference resistor; and
a second input of the reference amplifier is coupled to an output of the reference amplifier, and wherein the output of the reference amplifier is coupled to the first input of the amplifier.

8. The apparatus of claim 1, further comprising:
a decoder configured to generate a digital signal fed into the digital-to-analog converter.

9. A method comprising:
configuring an digital-to-analog converter to operate in a fine current adjustment mode to control a current flowing through a source follower coupled in series with the digital-to-analog converter; and
configuring the digital-to-analog converter to operate in a coarse current adjustment mode to control the current flowing through the source follower coupled in series with the digital-to-analog converter, wherein the digital-to-analog converter comprises a first digital-to-analog conversion device controlled by lower bits of a digital signal, and a second digital-to-analog conversion device controlled by upper bits of the digital signal.

10. The method of claim 9, further comprising:
generating the digital signal using a decoder;
applying the lower bits of the digital signal to the first digital-to-analog conversion device; and
applying the upper bits of the digital signal to the second digital-to-analog conversion device.

11. The method of claim 10, wherein:
the first digital-to-analog conversion device is a R2R digital-to-analog converter; and
the second digital-to-analog conversion device is a thermometric digital-to-analog converter.

12. The method of claim 11, further comprising:
shifting the lower bits to the left by one bit in response to a mode transition from the fine current adjustment mode to the coarse current adjustment mode.

13. The method of claim 11, further comprising:
tying at least one bit of the upper bits to a logic low stage in response to a mode transition from the fine current adjustment mode to the coarse current adjustment mode.

14. The method of claim 9, further comprising:
providing an amplifier to control a gate voltage of the source follower, wherein:
- a first input of the amplifier is configured to be coupled to a predetermined reference;
- a second input of the amplifier is coupled to a common node of the source follower and the digital-to-analog converter; and
- an output of the amplifier is coupled to a gate of the source follower.

15. The method of claim 14, wherein:
the first input of the amplifier is a non-inverting input of the amplifier; and
the second input of the amplifier is an inverting input of the amplifier.

16. An apparatus comprising:
a first digital-to-analog converter configured to receive lower bits of a digital signal and convert the lower bits into a first analog current;
a second digital-to-analog converter configured to receive upper bits of the digital signal and convert the upper bits into a second analog current;
a source follower having a first drain/source terminal coupled to an electronic device, and a second drain/source terminal coupled to the first digital-to-analog converter and the second digital-to-analog converter, wherein a current flowing through the source follower is equal to a sum of the first analog current and the second analog current; and
an amplifier having a first input coupled to a reference generator, a second input coupled to the second drain/source terminal of the source follower, and an output coupled to a gate of the source follower.

17. The apparatus of claim 16, wherein:
the first digital-to-analog converter is a R2R digital-to-analog converter;
the second digital-to-analog converter is a thermometric digital-to-analog converter; and
the electronic device is a plurality of light emitting diodes.

18. The apparatus of claim 16, wherein:
the first digital-to-analog converter and the second digital-to-analog converter are configured to operate in either a fine current adjustment mode or a coarse current adjustment mode, and wherein during a transition from the fine current adjustment mode to the coarse current adjustment mode, control bits for controlling the first digital-to-analog converter are shifted to the left by one bit.

19. The apparatus of claim 16, wherein:
the source follower is an n-type transistor, and wherein the first drain/source terminal is a drain of the source follower, and the second drain/source terminal is a source of the source follower.

20. The apparatus of claim 16, further comprising:
a decoder configured to generate the digital signal.

\* \* \* \* \*